US010545598B2

(12) United States Patent
Yang et al.

(10) Patent No.: US 10,545,598 B2
(45) Date of Patent: Jan. 28, 2020

(54) DISPLAY PANEL, PRESSURE SENSITIVE TOUCH SCREEN, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Yingming Liu, Beijing (CN); Xiaoliang Ding, Beijing (CN); Rui Xu, Beijing (CN); Lei Wang, Beijing (CN); Ming Yang, Beijing (CN); Pengcheng Lu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 216 days.

(21) Appl. No.: 15/540,348

(22) PCT Filed: May 11, 2016

(86) PCT No.: PCT/CN2016/081686
§ 371 (c)(1),
(2) Date: Jun. 28, 2017

(87) PCT Pub. No.: WO2017/152485
PCT Pub. Date: Sep. 14, 2017

(65) Prior Publication Data
US 2018/0181247 A1 Jun. 28, 2018

(30) Foreign Application Priority Data

Mar. 10, 2016 (CN) .......................... 2016 1 0136567

(51) Int. Cl.
G06F 3/041 (2006.01)
H01L 27/12 (2006.01)
H01L 41/113 (2006.01)

(52) U.S. Cl.
CPC .......... *G06F 3/0414* (2013.01); *G06F 3/0412* (2013.01); *H01L 27/1255* (2013.01); *H01L 41/1132* (2013.01); *G06F 2203/04105* (2013.01)

(58) Field of Classification Search
None
See application file for complete search history.

(56) References Cited

U.S. PATENT DOCUMENTS 6,720,955 B2    4/2004   Sugawara et al.
2002/0158853 A1  10/2002  Sugawara et al.
(Continued)

FOREIGN PATENT DOCUMENTS

CN    102193225 A    9/2011
CN    102707470 A    10/2012
(Continued)

OTHER PUBLICATIONS

Search Report for International Application No. PCT/CN2016/081686 dated Nov. 28, 2016.
(Continued)

*Primary Examiner* — Christopher R Lamb
(74) *Attorney, Agent, or Firm* — Calfee, Halter & Griswold LLP

(57) ABSTRACT

A display panel, a pressure sensitive touch screen, and a display device are disclosed. Pressure sensitive touch structures are arranged between an array substrate and a counter
(Continued)

substrate. Each pressure sensitive touch structure includes a first touch electrode, a piezoelectric conversion layer, and a second touch electrode. In case each pressure sensitive touch structure is subject to a pressure, the pressure sensing unit determines the magnitude of pressure at the touch position by sensing a variation in the magnitude of voltage between the first touch electrode and the second touch electrode, thus realizing pressure touching. Since the pressure sensitive touch structures are embedded in the display panel, it is only required to make minor modification to the structural design of the display panel without being limited by the assembly tolerance. The detection accuracy is improved.

12 Claims, 5 Drawing Sheets

(56) References Cited

U.S. PATENT DOCUMENTS

2009/0309616 A1* 12/2009 Klinghult ................ G06F 3/044
 324/686
2013/0265256 A1* 10/2013 Nathan ................ G06F 3/0414
 345/173
2014/0063365 A1 3/2014 Li et al.
2014/0346493 A1* 11/2014 Lee ..................... G06F 3/0412
 257/40

FOREIGN PATENT DOCUMENTS

| CN | 104409473 A | 3/2015 |
| CN | 105117058 A | 12/2015 |
| CN | 205038626 U | 2/2016 |
| CN | 105373228 A | 3/2016 |

OTHER PUBLICATIONS

First Office Action for Chinese Patent Application No. 201610136567.0 dated Feb. 2, 2018.

* cited by examiner

DISPLAY PANEL, PRESSURE SENSITIVE TOUCH SCREEN, AND DISPLAY DEVICE

RELATED APPLICATIONS

The present application is the U.S. national phase entry of PCT/CN2016/081686, with an international filing date of May 11, 2016, which claims the benefit of Chinese Patent Application 201610136567.0, filed on Mar. 10, 2016, the entire disclosures of which are incorporated herein by reference.

TECHNICAL FIELD

The present disclosure relates to the field of display technology, and particularly to a display panel, a pressure sensitive touch screen, and a display device.

BACKGROUND

A pressure sensing technique refers to a technique in which an external force is detected, and has been applied to industrial control, medical field, or the like. Currently, in the display field, especially in the field of mobile phone or tablet computer, additional structures are added in a backlight of a liquid crystal display panel or a middle frame of a mobile phone to realize pressure sensing. In this design, it is required to modify the structural design of the liquid crystal display panel or mobile phone. Furthermore, since the assembly tolerance is relatively large, the detection accuracy of this design is limited.

Therefore, it is a pressing problem for an ordinary skilled person in the art to realize pressure sensing at high detection accuracy in the premise that minor physical modification is made to the display panel.

SUMMARY

Embodiment of the present disclosure provide a display panel, a pressure sensitive touch screen, and a display device, in which pressure sensitive touch structures are embedded in the display panel to realize the function of pressure touching. It is only required to make minor modification to the structural design of the display panel without being limited by the assembly tolerance, and the detection accuracy is improved.

An embodiment of the present disclosure provides a display panel, comprising: an array substrate, a counter substrate opposite to the array substrate, and a plurality of pixel units which are arranged in a matrix between the array substrate and the counter substrate, wherein the display panel further comprises a plurality of pressure sensitive touch structures between the array substrate and the counter substrate, and wherein each of the pressure sensitive touch structures comprises a first touch electrode, a piezoelectric conversion layer, and a second touch electrode which are arranged in this order on a side of the array substrate facing the counter substrate.

In an exemplary embodiment, each of the plurality of pixel units comprises a first conductive layer and a second conductive layer which are arranged in this order on the array substrate. Each of the plurality of pixel units further comprises a light emitting layer which is arranged between the first conductive layer and the second conductive layer, the first conductive layer is an anode layer, and the second conductive layer is a cathode layer.

In an exemplary embodiment, each of the plurality of pixel units comprises a first conductive layer and a second conductive layer which are arranged in this order on the array substrate. Each of the plurality of pixel units further comprises an insulating layer which is arranged between the first conductive layer and the second conductive layer, the first conductive layer is a pixel electrode layer, and the second conductive layer is a common electrode layer.

In an exemplary embodiment, the second conductive layer is multiplexed as the second touch electrode, and the first touch electrode and the first conductive layer are arranged in a same layer, made from a same material and insulated from each other.

In an exemplary embodiment, the display panel further comprises a black matrix which is arranged between the array substrate and the counter substrate, wherein an orthographic projection of the first touch electrode on the array substrate falls within an orthographic projection of the black matrix on the array substrate.

In an exemplary embodiment, the second touch electrode and the first conductive layer are arranged in a same layer, made from a same material and insulated from each other.

In an exemplary embodiment, the display panel further comprises a black matrix which is arranged between the array substrate and the counter substrate, wherein an orthographic projection of the second touch electrode on the array substrate falls within an orthographic projection of the black matrix on the array substrate.

In an exemplary embodiment, the display panel further comprises pressure sensing units, each of the pressure sensing units is electrically connected to each of the pressure sensitive touch structures, wherein each of the pressure sensing units is configured to determine the magnitude of pressure at the touch position, by sensing a variation in the magnitude of voltage between the first touch electrode and the second touch electrode during the pressure touching stage.

In an exemplary embodiment, each of the pressure sensing units comprises a pressure sensing circuit and a pressure determining circuit which correspond to each of the pressure sensitive touch structures. The pressure sensing circuit is configured to amplify the voltage of the corresponding pressure sensitive touch structure and to output the amplified voltage. The pressure determining circuit is configured to determine touch position magnitude of pressure according to the voltage output by the pressure sensing circuit.

In an exemplary embodiment, the pressure sensing circuit comprises a switch transistor, a first capacitor, and an amplifying transistor. The switch transistor comprises a gate which is connected with a reset control terminal, a source which is connected with a reset signal terminal, and a drain which is connected with a first terminal of the first capacitor and the first touch electrode of the corresponding pressure sensitive touch structure. A second terminal of the first capacitor is connected with a first reference signal terminal. The amplifying transistor comprises a gate which is connected with the first terminal of the first capacitor, a source which is connected with a second reference signal terminal, and a drain which is connected with the pressure determining circuit.

In an exemplary embodiment, the pressure sensing circuit comprises a switch transistor, a first capacitor, and an amplifying transistor. The switch transistor comprises a gate which is connected with a reset control terminal, a source which is connected with a reset signal terminal, and a drain which is connected with a first terminal of the first capacitor and the first touch electrode of the corresponding pressure sensitive touch structure. A second terminal of the first capacitor is connected with a first reference signal terminal. The amplifying transistor comprises a gate which is connected with an amplifying control terminal, a source which is connected with a first terminal of the first capacitor, and a drain which is connected with the pressure determining circuit.

In an exemplary embodiment, the pressure sensing circuit further comprises an amplifier, a second capacitor, and a switch device. The amplifier comprises a positive phase input terminal which is connected with a third reference signal terminal, a negative phase input terminal which is connected with a drain of the amplifying transistor, and an output terminal which is connected with the pressure determining circuit. The second capacitor is connected between the negative phase input terminal and the output terminal of the amplifier. The switch device is connected between the negative phase input terminal and the output terminal of the amplifier.

In an exemplary embodiment, the piezoelectric conversion layer comprises piezoelectric material.

In an exemplary embodiment, the piezoelectric material is zinc oxide.

An embodiment of the present disclosure further provides a pressure sensitive touch screen, which comprises a display panel described in embodiments of the present disclosure.

In an exemplary embodiment, the pressure sensitive touch screen further comprises pressure sensing units, each of the pressure sensing units is electrically connected to each of the pressure sensitive touch structures, wherein each of the pressure sensing units is configured to determine the magnitude of pressure at the touch position, by sensing a variation in the magnitude of voltage between the first touch electrode and the second touch electrode during the pressure touching stage.

In an exemplary embodiment, each of the pressure sensing units comprises a pressure sensing circuit and a pressure determining circuit which correspond to each of the pressure sensitive touch structures. The pressure sensing circuit is configured to amplify the voltage of the corresponding pressure sensitive touch structure and to output the amplified voltage. The pressure determining circuit is configured to determine the magnitude of pressure at the touch position according to the voltage output by the pressure sensing circuit.

In an exemplary embodiment, the pressure sensing circuit comprises a switch transistor, a first capacitor, and an amplifying transistor. The switch transistor comprises a gate which is connected with a reset control terminal, a source which is connected with a reset signal terminal, and a drain which is connected with a first terminal of the first capacitor and the first touch electrode of the corresponding pressure sensitive touch structure. A second terminal of the first capacitor is connected with a first reference signal terminal. The amplifying transistor comprises a gate which is connected with the first terminal of the first capacitor, a source which is connected with a second reference signal terminal, and a drain which is connected with the pressure determining circuit.

In an exemplary embodiment, the pressure sensing circuit comprises a switch transistor, a first capacitor, and an amplifying transistor. The switch transistor comprises a gate which is connected with a reset control terminal, a source which is connected with a reset signal terminal, and a drain which is connected with a first terminal of the first capacitor and the first touch electrode of the corresponding pressure sensitive touch structure. A second terminal of the first capacitor is connected with a first reference signal terminal. The amplifying transistor comprises a gate which is connected with an amplifying control terminal, a source which is connected with a first terminal of the first capacitor, and a drain which is connected with the pressure determining circuit.

In an exemplary embodiment, the pressure sensing circuit further comprises an amplifier, a second capacitor, and a switch device. The amplifier comprises a positive phase input terminal which is connected with a third reference signal terminal, a negative phase input terminal which is connected with a drain of the amplifying transistor, and an output terminal which is connected with the pressure determining circuit. The second capacitor is connected between the negative phase input terminal and the output terminal of the amplifier. The switch device is connected between the negative phase input terminal and the output terminal of the amplifier.

An embodiment of the present disclosure further provides a display device, which comprises a pressure sensitive touch screen described in embodiments of the present disclosure.

Embodiments of the present disclosure provide the display panel, the pressure sensitive touch screen, and the display device. The pressure sensitive touch structures are arranged between the array substrate and the counter substrate. Each of the pressure sensitive touch structures comprises a first touch electrode, a piezoelectric conversion layer, and a second touch electrode. In case piezoelectric material in the piezoelectric conversion layer is subject to a pressure, positive and negative ions displace relatively, so that the positive and negative charge center no longer overlap, and a voltage is developed between a first touch electrode and a second touch electrode. Therefore, in case the pressure sensitive touch structures are subject to a pressure, the pressure sensing units determine the magnitude of pressure at the touch position by sensing a variation in the magnitude of voltage between the first touch electrode and the second touch electrode, thus realizing the function of pressure touching. Since the pressure sensitive touch structures are embedded in the display panel, it is only required to make minor modification to the structural design of the display panel without being limited by the assembly tolerance, and the detection accuracy is improved.

DETAILED DESCRIPTION OF EMBODIMENTS

Figure 1A:
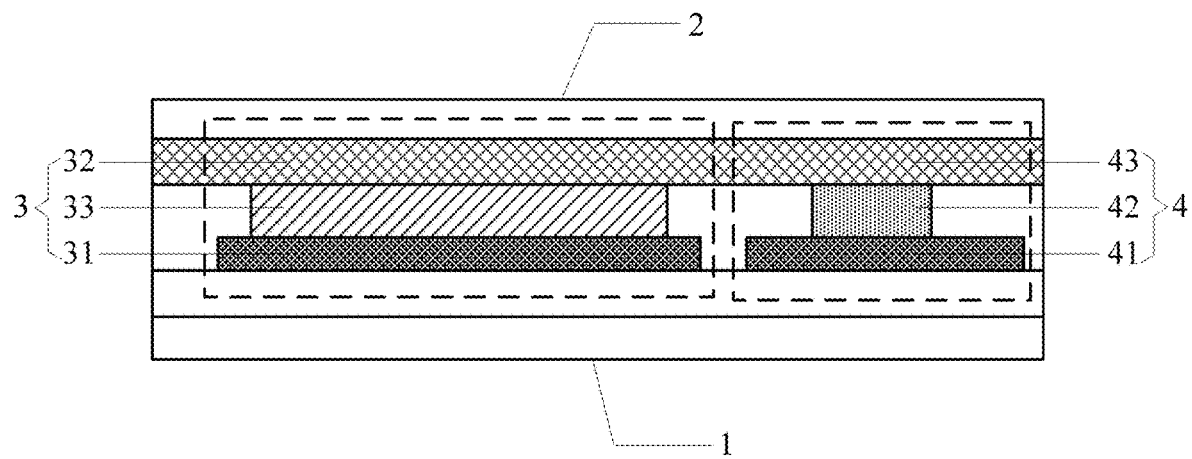
FIG. 1a is a structural diagram for illustrating a pressure sensitive touch screen in an embodiment of the present disclosure.

Specific embodiments of the present disclosure will be further described hereinafter with reference to the drawings and embodiments. The following embodiments are only used for explaining more clearly the technical solution of the present disclosure rather than limiting the protection scope of the present disclosure.

The shapes and sizes of components in the drawings are not drawn in a true scale, and only intend to illustrate the content of the present disclosure.

As shown in FIGS. 1a-2b, in an embodiment of the present disclosure, a pressure sensitive touch screen comprises: an array substrate 1, a counter substrate 2 which is arranged opposite to the array substrate 1, and a plurality of pixel units 3 which are arranged in a matrix between the array substrate 1 and the counter substrate 2. The pressure sensitive touch screen further comprises: pressure sensitive touch structures 4 which are arranged between the array substrate 1 and the counter substrate 2, and pressure sensing units 5 (not shown in FIGS. 1a-2b) which are electrically connected to the pressure sensitive touch structures 4. Each of the pressure sensitive touch structures 4 comprises a first touch electrode 41, a piezoelectric conversion layer 42, and a second touch electrode 43 which are arranged in this order on a side of the array substrate 1 facing the counter substrate 2. Each of the pressure sensing units 5 is configured to determine the magnitude of pressure at the touch position, by sensing a variation in the magnitude of voltage between the first touch electrode 41 and the second touch electrode 43 during the pressure touching stage.

In the above pressure sensitive touch screen, the pressure sensitive touch structures are arranged between the array substrate and the counter substrate. Each of the pressure sensitive touch structures comprises a first touch electrode, a piezoelectric conversion layer, and a second touch electrode. In case piezoelectric material in the piezoelectric conversion layer is subject to a pressure, positive and negative ions displace relatively, so that the positive and negative charge center no longer overlap, and a voltage is developed between a first touch electrode and a second touch electrode. Therefore, in case the pressure sensitive touch structures are subject to a pressure, the pressure sensing units determine the magnitude of pressure at the touch position by sensing a variation in the magnitude of voltage between the first touch electrode and the second touch electrode, thus realizing the function of pressure touching. Since the pressure sensitive touch structures are embedded in the display panel, it is only required to make minor modification to the structural design of the display panel without being limited by the assembly tolerance, and the detection accuracy is improved.

Furthermore, in an embodiment of the present disclosure, the piezoelectric material is an inorganic piezoelectric material, an organic piezoelectric material, or a composite piezoelectric material, and the present disclosure is not limited in this aspect.

For example, in an embodiment of the present disclosure, piezoelectric material is zinc oxide, and the present disclosure is not limited in this aspect.

In implementations, the pressure sensitive touch screen is a liquid crystal display screen or an organic light emitting display screen, and the present disclosure is not limited in this aspect.

In particular, in an embodiment of the present disclosure, as shown in FIGS. 1a-2b, each of the plurality of pixel units 3 comprises a first conductive layer 31 and a second conductive layer 32 which are arranged in this order on the array substrate 1.

Figure 1B:
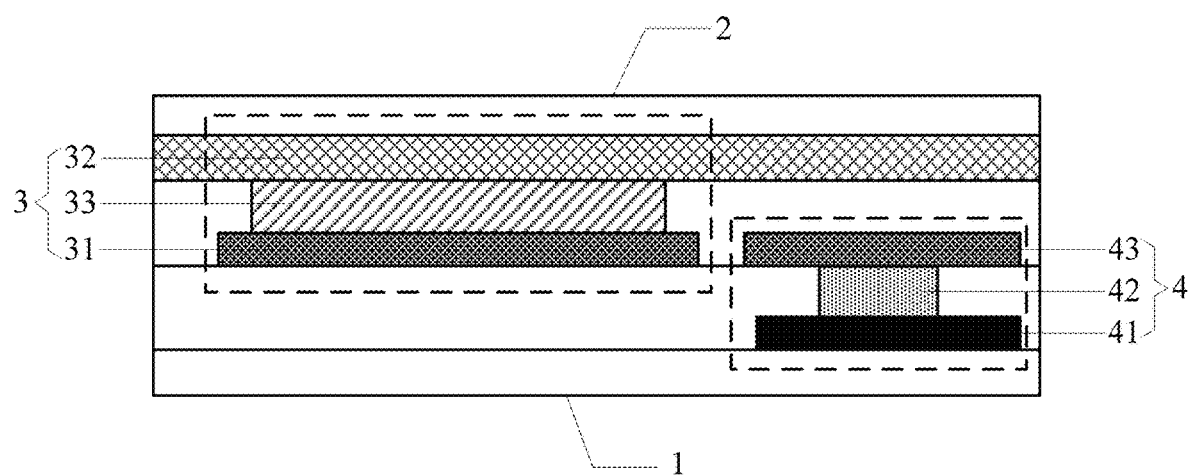
FIG. 1b is a structural diagram for illustrating a pressure sensitive touch screen in an embodiment of the present disclosure.

In an exemplary embodiment, as shown in FIGS. 1a-1b, the first conductive layer 31 is an anode layer, and the second conductive layer 32 is a cathode layer. Each of the plurality of pixel units 3 further comprises a light emitting layer 33 which is arranged between the first conductive layer 31 and the second conductive layer 32. Namely, the pressure sensitive touch screen described above is an organic light emitting display screen.

Figure 2A:
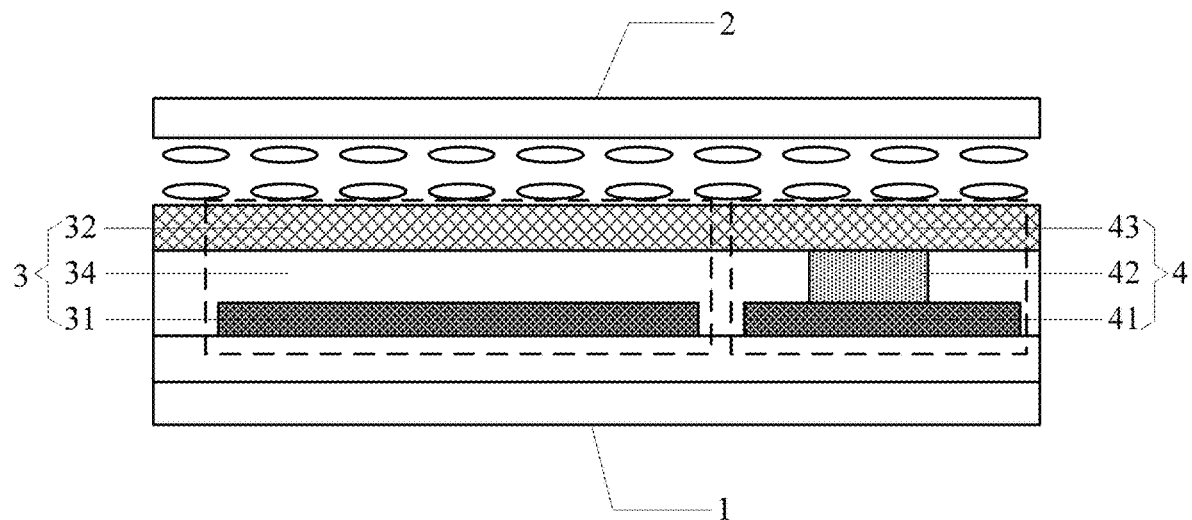
FIG. 2a is a structural diagram for illustrating a pressure sensitive touch screen in an embodiment of the present disclosure.
Figure 2B:
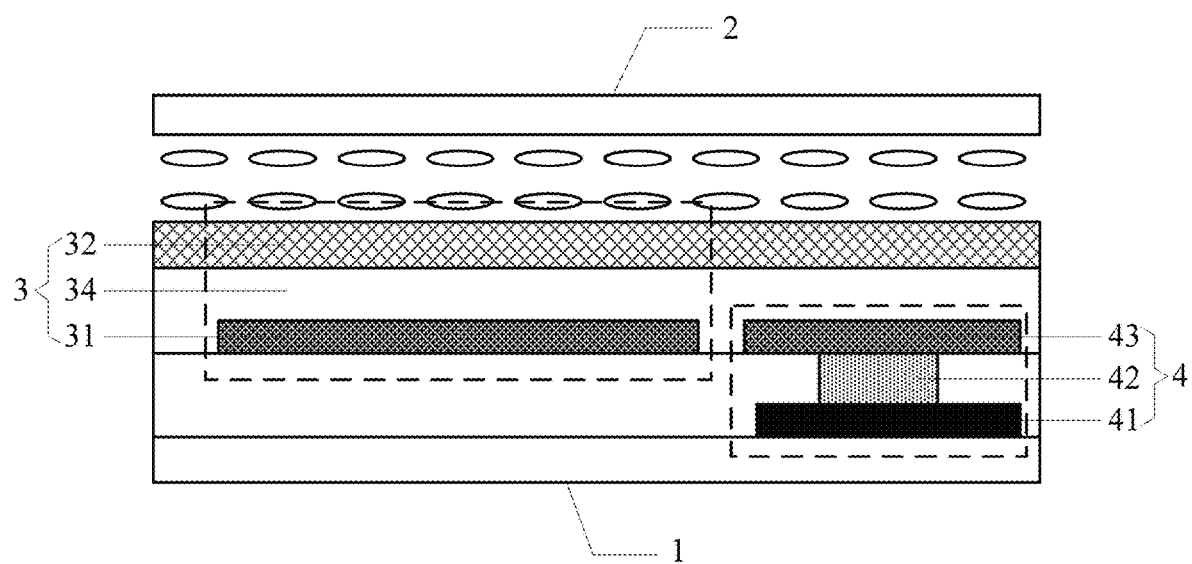
FIG. 2b is a structural diagram for illustrating a pressure sensitive touch screen in an embodiment of the present disclosure.

In an alternative embodiment, as shown in FIGS. 2a-2b, the first conductive layer 31 is a pixel electrode layer, and the second conductive layer 32 is a common electrode layer. Each of the plurality of pixel units further comprises an insulating layer 34 which is arranged between the first conductive layer 31 and the second conductive layer 32. Namely, the pressure sensitive touch screen described above is a liquid crystal display screen.

For example, in implementations of the pressure sensitive touch screen, as shown in FIG. 1a and FIG. 2a, the second conductive layer 32 is multiplexed as the second touch electrode 43, and the first touch electrode 41 and the first conductive layer 31 are arranged in a same layer, made from a same material and insulated from each other. In this way, the second conductive layer 32 is multiplexed as the second touch electrode 43. Since the first touch electrode 41 and the first conductive layer 31 are arranged in a same layer, the process for preparing the first touch electrode 41 and the second touch electrode 43 separately is omitted, which saves production cost.

In implementations, in an embodiment of the present disclosure, the pressure sensitive touch screen further comprises a black matrix which is arranged between the array substrate and the counter substrate, and an orthographic projection of the first touch electrode on the array substrate falls within an orthographic projection of the black matrix on the array substrate. This avoids effects on the aperture ratio.

For example, in implementations, in an embodiment of the present disclosure, as shown in FIG. 1b and FIG. 2b, the second touch electrode 43 and the second conductive layer 32 are arranged in a same layer, made from a same material and insulated from each other. In this way, the process for preparing the second touch electrode separately is omitted, which saves production cost.

In implementations, in an embodiment of the present disclosure, the pressure sensitive touch screen further comprises a black matrix which is arranged between the array substrate and the counter substrate, and an orthographic projection of the black matrix on the array substrate covers an orthographic projection of the second touch electrode on the array substrate. This avoids effects on the aperture ratio.

In implementations, in an embodiment of the present disclosure, metal electrodes are usually arranged on the array substrate. Of course, from the view point of simplifying the fabricating process, it is also possible to arrange the first touch electrode and/or the second touch electrode in a same layer and form from a same material as these metal electrodes on the array substrate. The present disclosure is not limited in this aspect.

Furthermore, in an embodiment of the present disclosure, both the array substrate and the counter substrate are flexible substrates. The present disclosure is not limited in this aspect.

Furthermore, in implementations, in an embodiment of the present disclosure, each of the pressure sensing units comprises: a pressure sensing circuit and a pressure determining circuit which correspond to each of the pressure sensitive touch structure in a one-to-one manner. The pressure sensing circuit is configured to amplify the voltage of the corresponding pressure sensitive touch structure and to output the amplified voltage. The pressure determining circuit is configured to determine the magnitude of pressure at the touch position according to the voltage which is output by pressure sensing circuit.

The present disclosure will be described hereinafter in detail with reference to specific embodiments. It is noted that these embodiments do not intend to be construed as limitations of the present disclosure, but to explain the present disclosure.

Figure 3A:
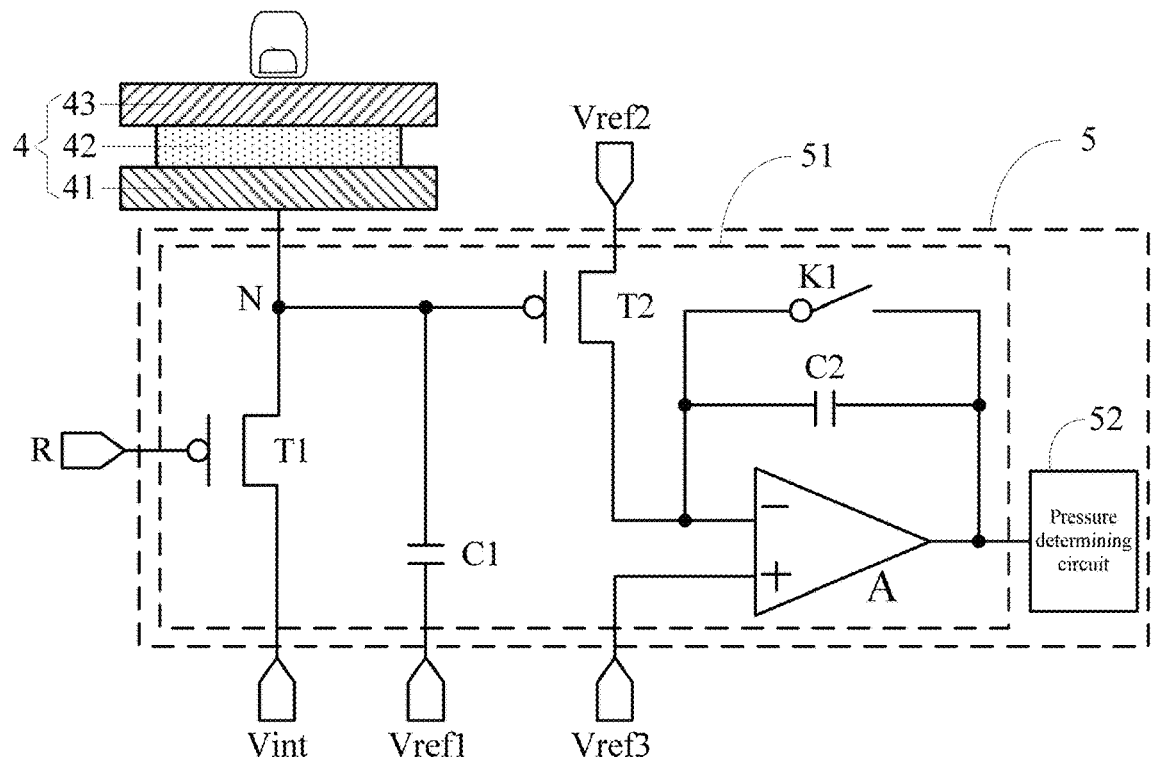
FIG. 3a is a structural diagram for illustrating a pressure sensing circuit in an embodiment of the present disclosure.
Figure 3B:
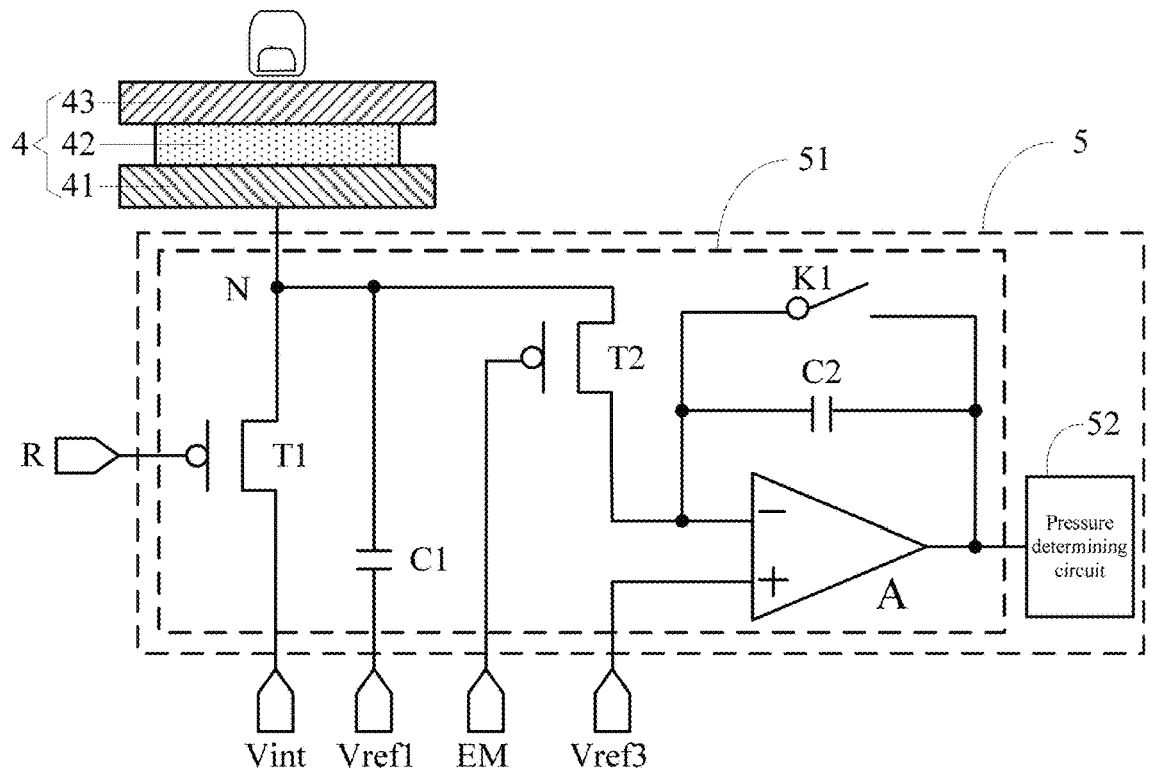
FIG. 3b is a structural diagram for illustrating a pressure sensing circuit in an embodiment of the present disclosure.

For example, in an embodiment of the pressure sensitive touch screen, as shown in FIGS. 3a-3b, each of the pressure sensing units 5 comprises a pressure sensing circuit 51 and a pressure determining circuit 52. The pressure sensing circuit 51 corresponds to each of the pressure sensitive touch structures 4 in a one-to-one manner. The pressure sensing circuit 51 is configured to amplify a voltage of the corresponding pressure sensitive touch structures 4 and then output the amplified voltage.

As shown in FIGS. 3a-3b, the pressure sensing circuit 51 comprises: a switch transistor T1, a first capacitor C1, and an amplifying transistor T2. The switch transistor T1 comprises a gate which is connected with a reset control terminal R, a source which is connected with a reset signal terminal Vint, and a drain which is connected with a first terminal of the first capacitor C1 and the first touch electrode 41 of the corresponding pressure sensitive touch structures 4. A second terminal of the first capacitor C1 is connected with a first reference signal terminal Vref1.

Figure 4A:
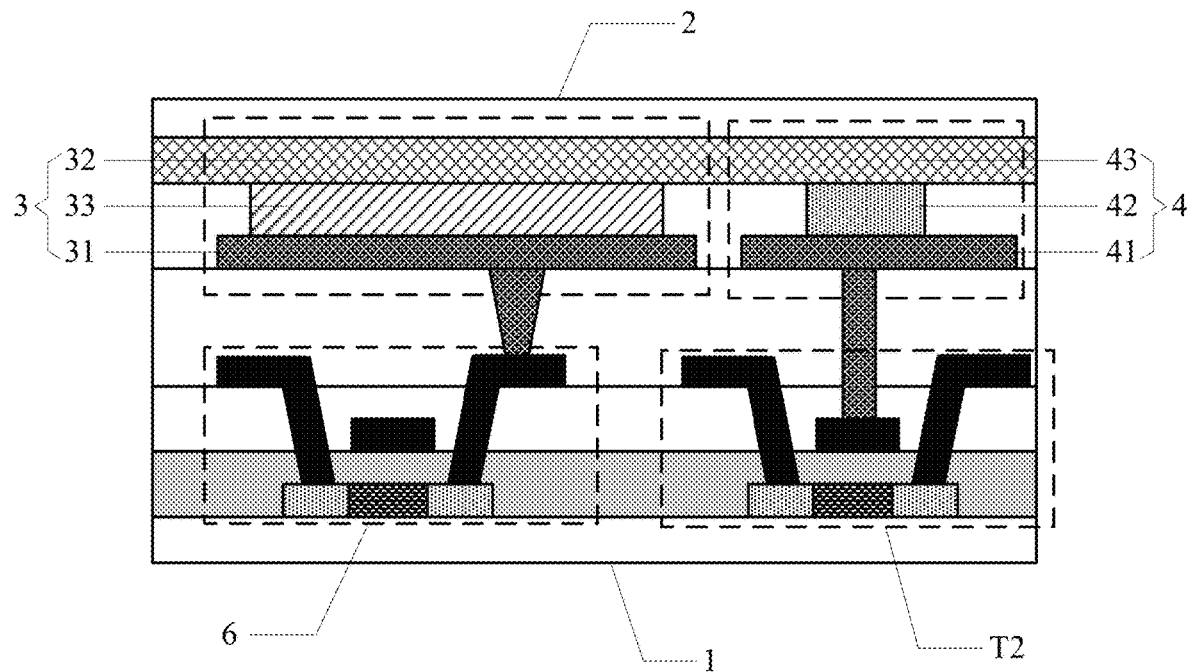
FIG. 4a is a structural diagram for illustrating a pressure sensitive touch screen in an embodiment of the present disclosure.
Figure 4B:
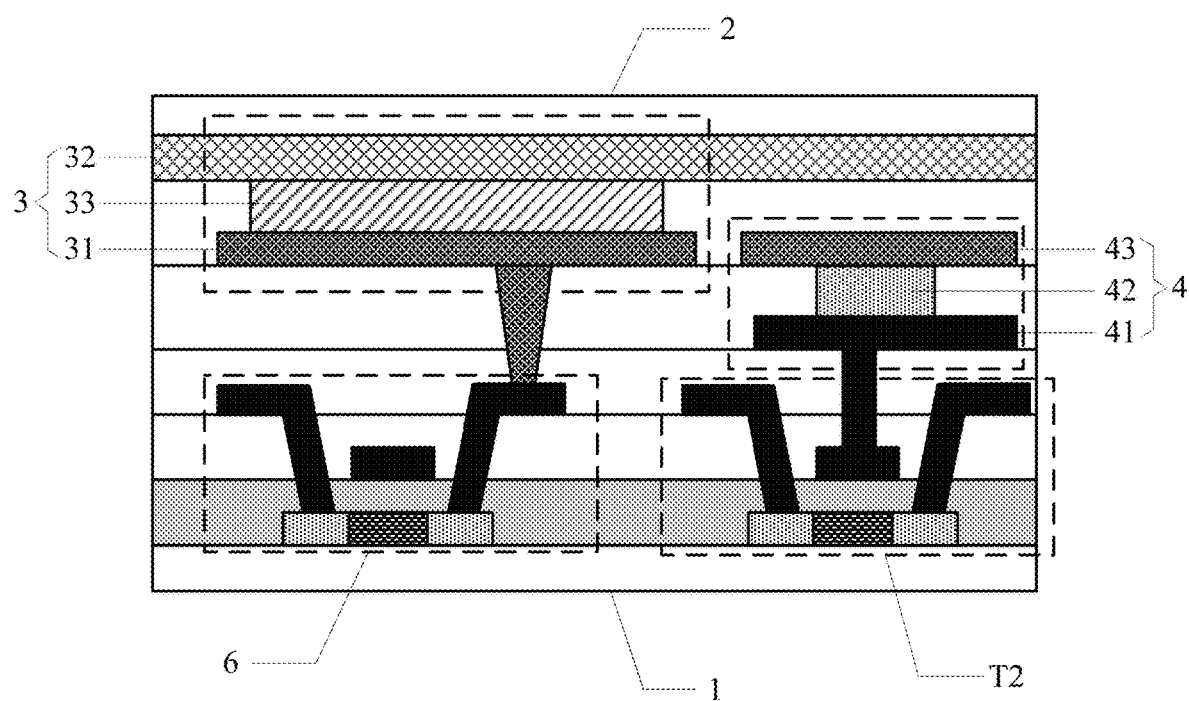
FIG. 4b is a structural diagram for illustrating a pressure sensitive touch screen in an embodiment of the present disclosure.
Figure 5A:
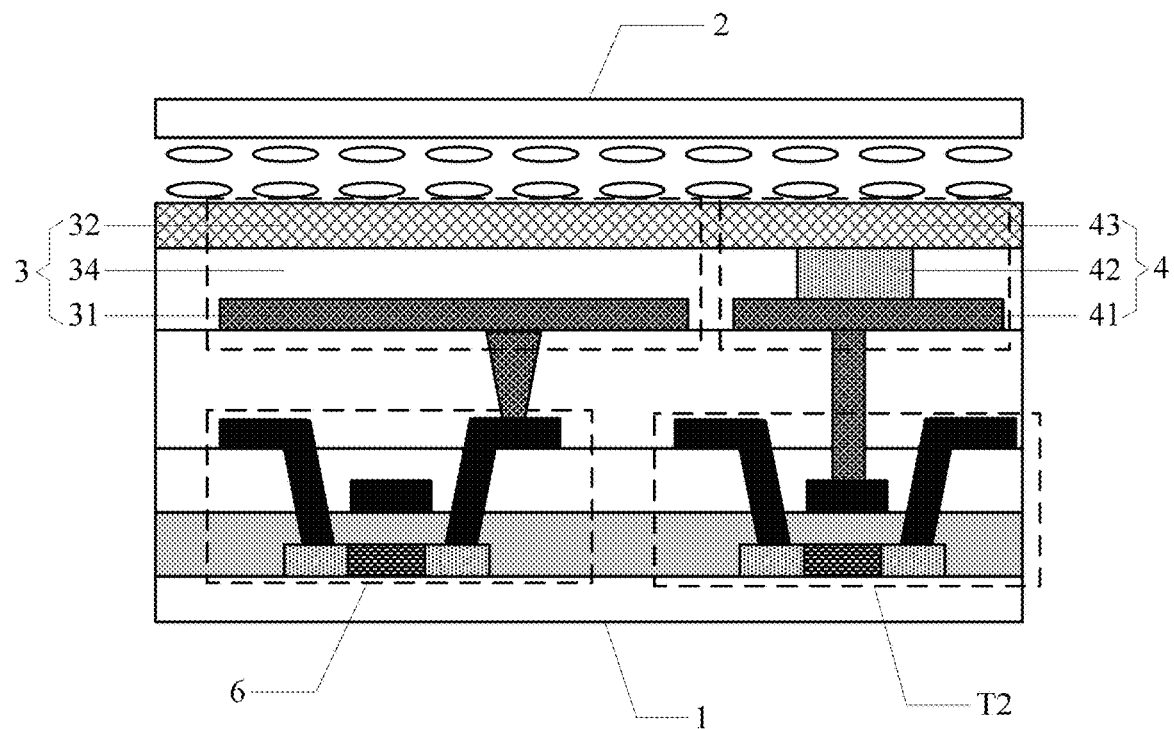
FIG. 5a is a structural diagram for illustrating a pressure sensitive touch screen in an embodiment of the present disclosure.
Figure 5B:
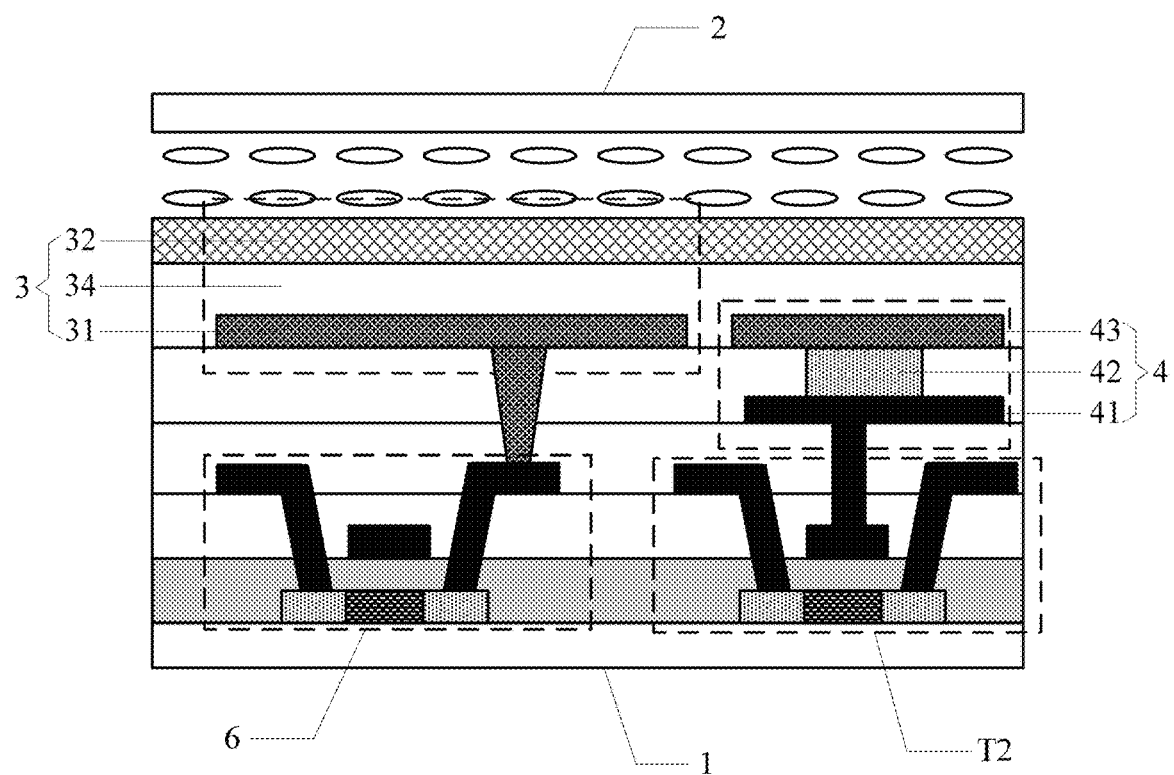
FIG. 5b is a structural diagram for illustrating a pressure sensitive touch screen in an embodiment of the present disclosure.

As shown in FIG. 3a, the amplifying transistor T2 comprises a gate which is connected with the first terminal of the first capacitor C1, a source which is connected with a second reference signal terminal Vref2, and a drain which is connected with the pressure determining circuit 52. Alternatively, as shown in FIG. 4b, the amplifying transistor T2 comprises a gate which is connected with an amplifying control terminal EM, a source which is connected with the first terminal of the first capacitor C1, and a drain which is connected with the pressure determining circuit 52.

For example, in order to improve sensing accuracy, in an embodiment of the pressure sensitive touch screen, as shown in FIG. 3a-FIG. 3b, the pressure sensing circuit 51 further comprises: an amplifier A, a second capacitor C2, and a switch device K1. The amplifier A comprises a positive phase input terminal which is connected with a third reference signal terminal Vref3, a negative phase input terminal which is connected with the drain of the amplifying transistor T2, and an output terminal which is connected with the pressure determining circuit 52. The second capacitor C2 is connected between the negative phase input terminal and the output terminal of the amplifier A. The switch device K1 is connected between the negative phase input terminal and the output terminal of the amplifier A.

By taking an embodiment shown in FIG. 3a, the operating principle of the pressure sensing circuit is described. During a first time period of the pressure touching time period, the reset control terminal R controls the switch transistor T1 to switch on, a node N is reset and charged, and the node N has a potential which equals to the potential of the reset signal terminal Vint. The amplifying transistor T2 switches on, and supplies the signal of the second reference signal terminal Vref2 to the negative phase input terminal of the amplifier, and this signal is amplified by the amplifier A. It is assumed that the voltage of the output terminal of the amplifier A, which is received by the pressure determining circuit 52 at this moment, is V1. When each of the pressure sensitive touch structures 4 is subject to a pressure, a voltage is developed between the first touch electrode 41 and the second touch electrode 43, the potential of the node N changes, and this leads to a change in the on-state of the amplifying transistor T2. Since the amplifying transistor T2 is operating in an amplifying state, a subtle change in the gate voltage will lead to a large current difference at the drain, and this current difference is further amplified by the amplifier A. Therefore, the voltage V2 of the output terminal of the amplifier A, which is received by the pressure determining circuit 52, will differ significantly from V1. The pressure determining circuit 52 compares V2 with V1 to obtain a difference between V1 and V2, and thus determines the magnitude of pressure.

By taking an embodiment shown in FIG. 3b, the operating principle of the pressure sensing circuit is described. During a first time period of the pressure touching time period, the reset control terminal R controls the switch transistor T1 to switch on, a node N is reset and charged, and the node N has a potential which equals to the potential of the reset signal terminal Vint. Under control of the amplifying control terminal EM, the amplifying transistor T2 switches on and supplies the potential of the node N to the negative phase input terminal of the amplifier, and this signal is amplified by the amplifier A. It is assumed that the voltage of the output terminal of the amplifier A, which is received by the pressure determining circuit 52 at this moment, is V1. When each of the pressure sensitive touch structures 4 is subject to a pressure, a voltage is developed between the first touch electrode 41 and the second touch electrode 43, the potential of the node N changes, and this leads to a change in the potential at the source of the amplifying transistor T2. Since the amplifying transistor T2 is operating in an amplifying state, a subtle change in the source voltage will lead to a large current difference at the drain, and this current difference is further amplified by the amplifier A. Therefore, the voltage V2 of the output terminal of the amplifier A, which is received by the pressure determining circuit 52, will differ significantly from V1. The pressure determining circuit 52 compares V2 with V1 to obtain a difference between V1 and V2, and thus determines the magnitude of pressure.

A specific configuration of the pressure sensing circuit has been described in the above embodiment, but the configuration of the pressure sensing circuit is not limited to the above embodiment. For example, other configuration known for the ordinary skilled person in the art is also applicable.

Furthermore, in an embodiment of the pressure sensitive touch screen, as shown in FIGS. 4a-5b, the array substrate 1 usually is further provided with a TFT 6 which is connected with the first conductive layer 31 of each of the plurality of pixel units 3. Therefore, the switch transistor T1 and the amplifying transistor T2 of the pressure sensing circuit are also arranged on the array substrate 1 (only the amplifying transistor T2 is shown in FIGS. 4a-5b). In this way, the switch transistor T1 and the amplifying transistor T2 of the pressure sensing circuit can be prepared during preparing other TFTs on the array substrate.

In the above embodiments, the pressure sensitive touch screen comprises a display panel and pressure sensitive touch structures which are embedded in the display panel. In an exemplary embodiment, the pressure sensing units are integrated in the display panel. In other embodiments, the pressure sensing units and the display panel are arranged discretely. In case the pressure sensing units and the display panel are arranged discretely, the pressure sensitive touch screen shown in FIGS. 1a-1b, 2a-2b, 4a-4b and 5a-5b actually corresponds to the display panel in embodiments of the present disclosure.

On basis of a same inventive concept, an embodiment of the present disclosure further provides a display device, which comprises a pressure sensitive touch screen in embodiments of the present disclosure. The display device for example is any product or component with a display function like a mobile phone, tablet computer, TV, monitor, notebook computer, digital photo frame, and navigator. As for embodiments of the display device, reference can be made to the above embodiments of the pressure sensitive touch screen.

In the above pressure sensitive touch screen and display device, the pressure sensitive touch structures are arranged between the array substrate and the counter substrate. Each of the pressure sensitive touch structures comprises a first touch electrode, a piezoelectric conversion layer, and a second touch electrode. In case piezoelectric material in the piezoelectric conversion layer is subject to a pressure, positive and negative ions displace relatively, so that the positive and negative charge center no longer overlap, and a voltage is developed between a first touch electrode and a second touch electrode. Therefore, in case the pressure sensitive touch structures are subject to a pressure, the pressure sensing units determine the magnitude of pressure at the touch position by sensing a variation in the magnitude of voltage between the first touch electrode and the second touch electrode, thus realizing the function of pressure touching. Since the pressure sensitive touch structures are embedded in the display panel, it is only required to make minor modification to the structural design of the display panel without being limited by the assembly tolerance, and the detection accuracy is improved.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A display panel, comprising: an array substrate, a counter substrate opposite to the array substrate, and a plurality of pixel units which are arranged in a matrix between the array substrate and the counter substrate,
   wherein the display panel further comprises a plurality of pressure sensitive touch structures between the array substrate and the counter substrate,
   wherein each of the pressure sensitive touch structures comprises a first touch electrode, a piezoelectric conversion layer, and a second touch electrode which are arranged in this order on a side of the array substrate facing the counter substrate,
   wherein the display panel further comprises pressure sensing units, each of the pressure sensing units is electrically connected to each of the pressure sensitive touch structures, wherein each of the pressure sensing units is configured to determine the magnitude of pressure at the touch position, by sensing a variation in the magnitude of voltage between the first touch electrode and the second touch electrode during the pressure touching stage,
   wherein each of the pressure sensing units comprises a pressure sensing circuit and a pressure determining circuit wherein the pressure sensing circuit and the pressure determining circuit correspond to each of the pressure sensitive touch structures, the pressure sensing circuit is configured to amplify the voltage of the corresponding pressure sensitive touch structure and to output the amplified voltage, and the pressure determining circuit is configured to determine the magnitude of pressure at the touch position according to the voltage output by the pressure sensing circuit, and
   wherein the pressure sensing circuit comprises a switch transistor, a first capacitor, and an amplifying transistor, the switch transistor comprises a first gate connected with a reset control terminal, a first source connected with a reset signal terminal, and a first drain connected with a first terminal of the first capacitor and the first touch electrode of the corresponding pressure sensitive touch structure, a second terminal of the first capacitor is connected with a first reference signal terminal, and the amplifying transistor comprises a second gate connected with the first terminal of the first capacitor, a second source connected with a second reference signal terminal, and a second drain connected with the pressure determining circuit.

2. The display panel of claim 1, wherein each of the plurality of pixel units comprises a first conductive layer and a second conductive layer which are arranged in this order on the array substrate, and
   each of the plurality of pixel units further comprises a light emitting layer arranged between the first conductive layer and the second conductive layer, wherein the first conductive layer is an anode layer, and the second conductive layer is a cathode layer.

3. The display panel of claim 1, wherein each of the plurality of pixel units comprises a first conductive layer and a second conductive layer arranged in this order on the array substrate, and
   each of the plurality of pixel units further comprises an insulating layer arranged between the first conductive layer and the second conductive layer, wherein the first conductive layer is a pixel electrode layer, and the second conductive layer is a common electrode layer.

4. The display panel of claim 2, wherein the second conductive layer is multiplexed as the second touch electrode, and the first touch electrode and the first conductive layer are arranged in a same layer, made from a same material and insulated from each other.

5. The display panel of claim 4, further comprising a black matrix arranged between the array substrate and the counter substrate, wherein an orthographic projection of the first touch electrode on the array substrate falls within an orthographic projection of the black matrix on the array substrate.

6. The display panel of claim 2, wherein the second touch electrode and the first conductive layer are arranged in a same layer, made from a same material and insulated from each other.

7. The display panel of claim 6, further comprising a black matrix arranged between the array substrate and the counter, wherein an orthographic projection of the second touch electrode on the array substrate falls within an orthographic projection of the black matrix on the array substrate.

8. The display panel of claim 1, wherein the pressure sensing circuit further comprises an amplifier, a second capacitor, and a switch device, the amplifier comprises a positive phase input terminal which is connected with a third reference signal terminal, a negative phase input terminal which is connected with a drain of the amplifying transistor, and an output terminal which is connected with the pressure determining circuit, the second capacitor is connected between the negative phase input terminal and the output terminal of the amplifier, and the switch device is connected between the negative phase input terminal and the output terminal of the amplifier.

9. The display panel of claim 1, wherein the piezoelectric conversion layer comprises piezoelectric material.

10. A pressure sensitive touch screen, comprising a display panel, the display panel comprises an array substrate, a counter substrate opposite to the array substrate, and a plurality of pixel units which are arranged in a matrix between the array substrate and the counter substrate, wherein the display panel further comprises a plurality of pressure sensitive touch structures between the array substrate and the counter substrate, wherein each of the pressure sensitive touch structures comprises a first touch electrode, a piezoelectric conversion layer, and a second touch electrode which are arranged in this order on a side of the array substrate facing the counter substrate, wherein the pressure sensitive touch screen further comprises pressure sensing units, each of the pressure sensing units is electrically connected to each of the pressure sensitive touch structures, wherein each of the pressure sensing units is configured to determine the magnitude of pressure at the touch position, by sensing a variation in the magnitude of voltage between the first touch electrode and the second touch electrode during the pressure touching stage, wherein each of the pressure sensing units comprises a pressure sensing circuit and a pressure determining circuit which correspond to each of the pressure sensitive touch structures, the pressure sensing circuit is configured to amplify the voltage of the corresponding pressure sensitive touch structure and to output the amplified voltage, and the pressure determining circuit is configured to determine the magnitude of pressure at the touch position according to the voltage output by the pressure sensing circuit, and wherein the pressure sensing circuit comprises a switch transistor, a first capacitor, and an amplifying transistor, the switch transistor comprises a first gate connected with a reset control terminal, a first source connected with a reset signal terminal, and a first drain connected with a first terminal of the first capacitor and the first touch electrode of the corresponding pressure sensitive touch structure, a second terminal of the first capacitor is connected with a first reference signal terminal, and the amplifying transistor comprises a second gate connected with the first terminal of the first capacitor, a second source connected with a second reference signal terminal, and a second drain connected with the pressure determining circuit.

11. The pressure sensitive touch screen of claim 10, wherein the pressure sensing circuit further comprises an amplifier, a second capacitor, and a switch device, the amplifier comprises a positive phase input terminal connected with a third reference signal terminal, a negative phase input terminal connected with a drain of the amplifying transistor, and an output terminal connected with the pressure determining circuit, the second capacitor is connected between the negative phase input terminal and the output terminal of the amplifier, and the switch device is connected between the negative phase input terminal and the output terminal of the amplifier.

12. A display device, comprising the pressure sensitive touch screen of claim 10.

* * * * *